United States Patent [19]
Olla et al.

[11] Patent Number: 5,309,321
[45] Date of Patent: May 3, 1994

[54] THERMALLY CONDUCTIVE SCREEN MESH FOR ENCAPSULATED INTEGRATED CIRCUIT PACKAGES

[75] Inventors: Michael A. Olla; Thomas P. Dolbear; Seyed H. Hashemi, all of Austin, Tex.

[73] Assignee: Microelectronics And Computer Technology Corporation, Austin, Tex.

[21] Appl. No.: 949,300

[22] Filed: Sep. 22, 1992

[51] Int. Cl.[5] ............................................. H05K 7/20
[52] U.S. Cl. .................... 361/714; 174/16.3; 174/35 R; 165/80.3; 165/185; 257/659; 257/796; 257/660; 257/713; 361/816
[58] Field of Search ............. 174/16.3, 35 R, 52.2, 174/52.4; 361/383, 386–389, 424; 257/705–707, 713, 712, 720–722, 789, 796, 659, 660; 165/80.3–80.4, 185

[56] References Cited

U.S. PATENT DOCUMENTS

| | | | |
|---|---|---|---|
| 3,694,699 | 9/1972 | Snyder et al. | 361/387 |
| 4,009,752 | 3/1977 | Wilson | 165/81 |
| 4,244,098 | 1/1981 | Barcus | 29/596 |
| 4,333,102 | 6/1982 | Jester et al. | 357/81 |
| 4,356,864 | 11/1982 | Ariga et al. | 165/80 |
| 4,407,006 | 9/1983 | Holick et al. | 357/68 |
| 4,421,161 | 12/1983 | Romania et al. | 165/80 |
| 4,465,130 | 8/1984 | Romania et al. | 165/185 |
| 4,541,004 | 9/1985 | Moore | 357/81 |
| 4,598,308 | 7/1986 | James et al. | 357/81 |
| 4,611,238 | 9/1986 | Lewis et al. | 357/81 |
| 4,620,216 | 10/1986 | Horvarth | 357/81 |
| 4,624,302 | 11/1986 | Hayden et al. | 165/80.2 |
| 4,682,208 | 7/1987 | Ohashi et al. | 357/81 |
| 4,682,651 | 7/1987 | Gabuzda | 165/80.2 |
| 4,715,430 | 12/1987 | Arnold et al. | 165/80.3 |
| 4,721,996 | 1/1988 | Tustaniwskyj et al. | 357/82 |
| 4,730,666 | 3/1988 | Flint et al. | 165/80.4 |
| 4,750,031 | 6/1988 | Miller et al. | 357/81 |
| 4,764,804 | 8/1988 | Sahara et al. | 174/16.3 |
| 4,868,349 | 9/1989 | Chia | 174/52.4 |
| 4,878,108 | 10/1989 | Phelps, Jr. et al. | 357/81 |
| 4,888,449 | 12/1989 | Crane et al. | 174/52.4 |
| 4,899,210 | 2/1990 | Lorenzetti et al. | 357/81 |
| 4,964,458 | 10/1990 | Flint et al. | 165/80.4 |
| 4,965,660 | 10/1990 | Ogihara et al. | 357/81 |
| 4,993,482 | 2/1991 | Dolbear et al. | 165/80.2 |
| 5,006,924 | 4/1991 | Frankeny et al. | 357/82 |
| 5,022,462 | 6/1991 | Flint et al. | 165/80.4 |
| 5,057,903 | 10/1991 | Olla | 357/72 |
| 5,070,936 | 12/1991 | Carroll et al. | 165/80.4 |
| 5,083,194 | 1/1992 | Bartilson | 357/81 |
| 5,146,314 | 9/1992 | Pankove | 361/387 |
| 5,155,579 | 10/1992 | Au Yeung | 361/389 |
| 5,156,923 | 10/1992 | Jha et al. | 361/388 |
| 5,166,772 | 11/1992 | Soldner et al. | 361/424 |

FOREIGN PATENT DOCUMENTS

| | | |
|---|---|---|
| 4106437 | 8/1991 | Fed. Rep. of Germany . |
| 0081735 | 4/1987 | Japan ............................. 361/386 |

OTHER PUBLICATIONS

Dombroski et al, "Thermal Conduction Module", IBM Technical Disclosure Bulletin, vol. 20, No. 6, Nov. 1977, pp. 2214–2215.

"Deltem TM Composite Heat Sinks Introduce A New Dimension to Electronics Heat Transfer", EG&G Wakefield Engineering, Product Brochure, Jun. 1989, pp. 1–4.

*Primary Examiner*—Gregory D. Thompson
*Attorney, Agent, or Firm*—Fulbright & Jaworski

[57] ABSTRACT

An encapsulated integrated circuit package having an integrated circuit chip with a plurality of electrical leads connected thereto and at least one thermally conductive screen mesh positioned adjacent to the chip. A non-electrically conductive thermosetting or thermoplastic material forms a housing enclosing the chip and bonded to the screen mesh. Preferably one of the layers is exposed to the outside of the housing and the screen mesh is secured to a substrate supporting the chip.

31 Claims, 2 Drawing Sheets

THERMALLY CONDUCTIVE SCREEN MESH FOR ENCAPSULATED INTEGRATED CIRCUIT PACKAGES

BACKGROUND OF THE INVENTION

The present invention is directed to an encapsulated integrated circuit package having a thermally conductive screen mesh molded into the package to improve the thermal performance.

The packaging of single or multiple integrated circuit chips or dice into conventional thermosetting or thermoplastic packages has been limited because of the poor thermal conductivity of the molding material limiting the amount of heat which can be dissipated from the package. In order to overcome this problem, solid metal slugs have been included in some encapsulants to improve transferring the generated heat out of the encapsulated integrated circuit package. However, such solutions have been expensive and such encapsulated packages are subject to failure due to the mismatch in the coefficient of thermal expansion between the metal slugs and the encapsulant.

SUMMARY OF THE INVENTION

The present invention is directed to an encapsulated integrated circuit package having at least one thermally conductive screen mesh positioned adjacent to an electronic component within the package. The screen mesh not only provides a large volume of high thermal conductivity structure for heat dissipation but also reduces stress due to the thermal mismatch between the high conductivity structure and the enclosure, thereby increasing the reliability of the package.

Accordingly, an object of the present invention is to provide a low cost plastic package having a thermally conductive structure molded directly into the package to improve the thermal performance while minimizing thermo-mechanically generated stresses due to temperature changes.

A still further object of the present invention is the provision of an encapsulated integrated circuit package having an integrated circuit chip with a plurality of electrical leads electrically connected either directly or indirectly to the chip. A thermally conductive screen mesh is positioned adjacent to the chip, and a non-electrically conductive thermosetting or thermoplastic material forms a housing enclosing the chip and is bonded to the screen mesh. The leads sealably extend through the housing.

Still a further object of the present invention is wherein a plurality of layers of screen mesh are positioned adjacent to the chip. Preferably one of the layers is exposed to the outside of the housing for increased heat transfer.

Still a further object of the present invention is the provision of a substrate, such as a fine pitch leadframe on a multichip module or a die paddle on a single chip package, within the package for supporting the chip and a plurality of fasteners securing the screen mesh to the substrate. The screen mesh may be positioned adjacent to the chip, the substrate, or both.

Yet a still further object of the present invention is wherein the screen mesh is from a group consisting of copper, aluminum and graphite.

Further objects, features and advantages will be apparent from the following description of a presently preferred embodiment of the invention, given for the purpose of disclosure, and taken in conjunction with the accompanying drawing.

DESCRIPTION OF THE PREFERRED EMBODIMENT

While the encapsulated integrated circuit package of the present invention may take various forms the simplest contains a single integrated circuit die or chip. However the present package is useful for single and multi-chip modules, and for purpose of illustration only will be described in combination with a plurality of integrated circuit chips positioned on one side of a support or substrate.

Figure 1:
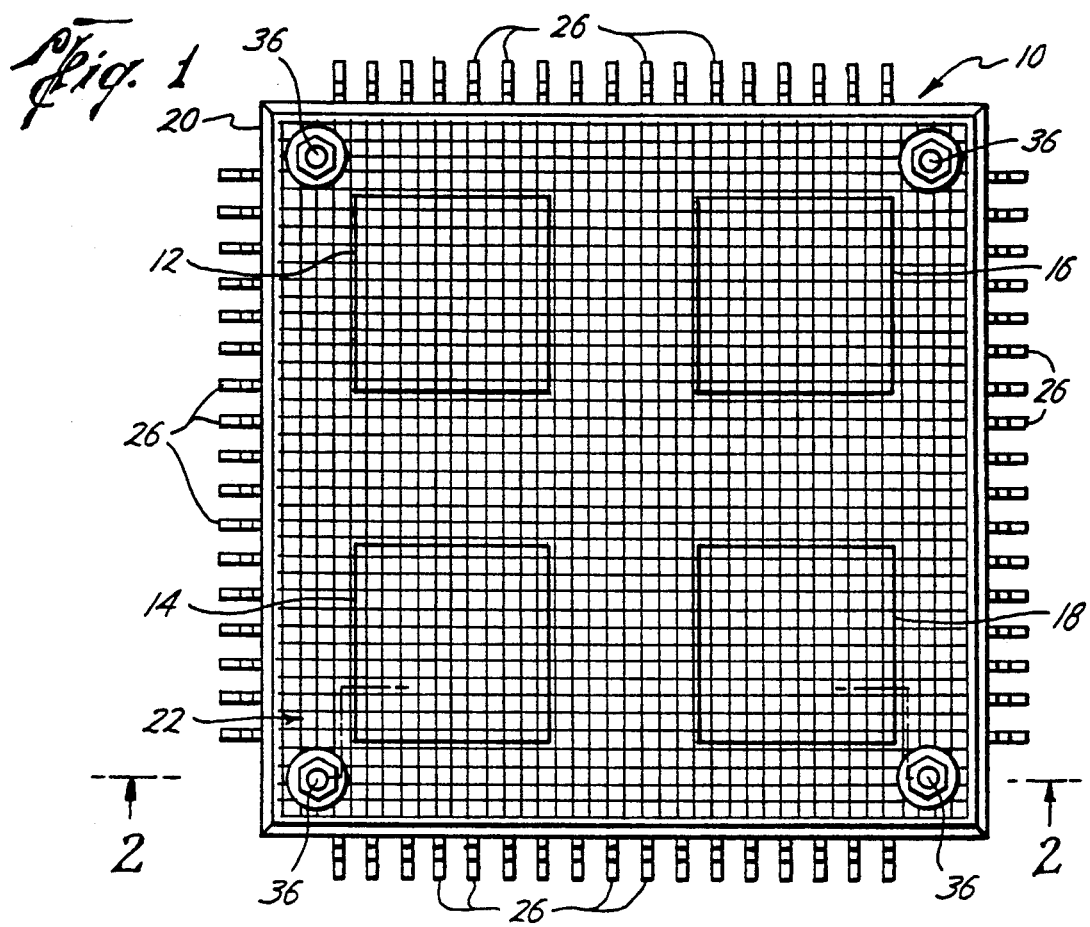
FIG. 1 is an elevational top view of the encapsulated integrated circuit package of the present invention.
Figure 2:
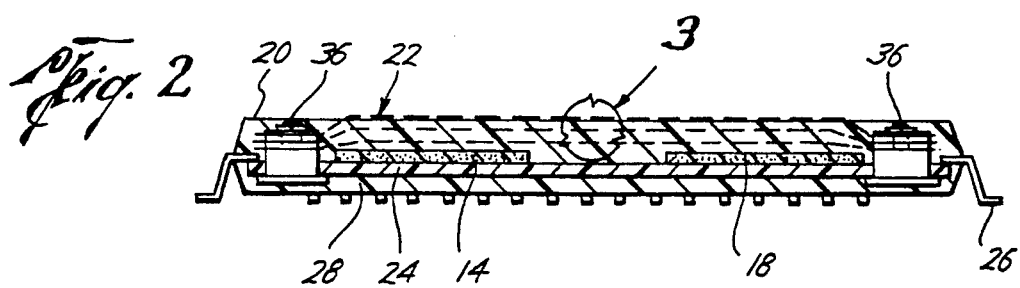
FIG. 2 is a cross-sectional view taken along the line 2—2 of FIG. 1.
Figure 3:
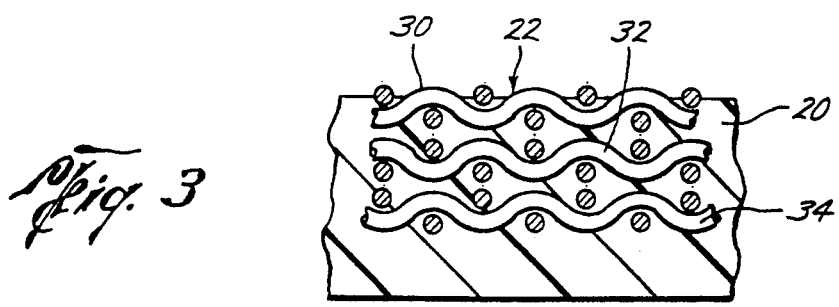
FIG. 3 is an enlarged fragmentary cross-sectional view taken of the insert 3 of FIG. 2.

Referring to the drawings and particularly to FIGS. 1 and 2, the reference numeral 10 generally indicates the encapsulated integrated circuit package of the present invention and generally includes one or more integrated circuit dice or chips, here shown as four, being numbers 12, 14, 16, and 18, a housing 20, single or multiple wire screen meshes generally indicated by the reference numeral 22, and a support or substrate 24.

Electrical leads 26 extend out of the housing 20. Leads 26 are integral to a general purpose lead frame and are indirectly connected to chips 12, 14, 16 and 18, for instance by tape-automated-bonded (TAB) leads or wire bonds (not shown). Alternatively, leads 26 could be directly connected to the chips. Whichever the case, leads 26 must be in electrical communication with the chips. The substrate 24 may also include a heat spreader 28 such as a metal copper heat spreader. The housing 20 is a non-electrically conductive thermosetting or thermoplastic material which sealingly encloses the substrate 24 and heat spreader 28 as well as the integrated circuit chips 12, 14, 16 and 18. The thermoplastic material may be of any suitable material, such as polyphenylene sulfide, polyetherimide, polyethersulfone, liquid crystal polymers, or polyetheretherketone. Suitable thermosetting materials include epoxies such as anhydride epoxy, novalak epoxy, polyimide epoxy and the like. Plastic is generally the preferred housing material.

The wire screen mesh 22 comprises at least one thermally conductive screen mesh positioned near or adjacent to the chip or chips 12, 14, 16 and 18 and, preferably, comprises a plurality of flexible layers of screen mesh shown here as layers 30, 32, and 34. Preferably one of the layers such as 30 is exposed to the outside of the housing 20 and thus provides a direct high conductivity path to the outside surface of the package while the other layers are enclosed in the housing and at least one layer, such as layer 34, conforms to the top surfaces of the chips. Furthermore, one or more fasteners such as hollow or solid stand-offs 36 are stacked or riveted to the substrate 24 and to the corners of the wire screen mesh 22 for securing the mesh 22 to the substrate 24. While the wire screen mesh may be of any suitable thermally conductive material the materials of copper, aluminum and graphite are most satisfactory.

The wire screen mesh 22 has several important advantages over a conventional solid metal block slug. First, its thermal performance is very comparable to a solid slug as a plurality of screens can provide a comparable volume of thermally conductive material. In addition, and more importantly, the wire screen mesh 22 reduces the thermo-mechanical stress problems that occur with solid slugs of metal. Due to the smaller sizes of the individual strands of the screen mesh the thermo-mechanical stresses created due to the differences in the coefficient of thermal expansion between the housing 20 and the wire screen mesh 22 are minimized. Thirdly, the flexibility of the wire screen mesh 22 allows it to be conformed to and cool an integrated circuit chip structure which has an uneven top surface. As an example only, the individual screens 30, 32 and 34 may have wires 4.5 mils thick with 5.5 mil spacings therebetween to form a mesh with 100 wires per inch. Fourthly, wire screen mesh 22 provides a high degree of RF shielding for the chips.

Figure 4:
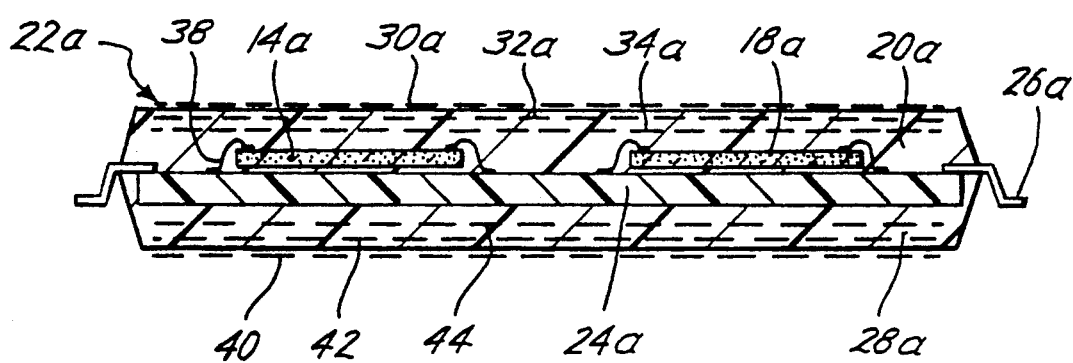
FIG. 4 is a cross-sectional view of another encapsulated integrated circuit package of the present invention.

Referring now to FIG. 4, another embodiment of the present invention is shown wherein like parts are similarly numbered with the addition of the suffix "a". As may be seen, package 10a encapsulates chips 14a and 18a which are supported by substrate 24a and connected to leads 26a by wire bonds 38. Screen mesh layers 30a, 32a and 34a are positioned adjacent to but spaced from the chips to prevent them from contacting and short-circuiting wire bonds 36. In addition, a second screen mesh comprising layers 40, 42 and 44 (similar to 30a, 32a and 34a, respectively) is positioned adjacent to substrate 24a on the side opposite chips 14a and 18a to further enhance the package's thermal conductivity. Furthermore, second screen mesh layers 40, 42 and 44 may be utilized with or without including screen mesh layers 30a, 32a and 34a on the opposite side of substrate 24a.

The present invention, therefore, is well adapted to carry out the objects and attain the ends and advantages mentioned as well as others inherent therein. While a presently preferred embodiment of the invention has been given for the purpose of disclosure, numerous changes and the details of construction and arrangement of parts will be readily apparent to those skilled in the art and which are encompassed within the spirit of the invention and the scope of the appended claims.

What is claimed is:

1. An encapsulated integrated circuit package, comprising:
   an electronic component;
   a plurality of layers of thermally conductive screen mesh positioned adjacent to the component;
   a non-electrically conductive thermosetting or thermoplastic material forming a housing enclosing the component and bonded to the screen mesh; and
   a plurality of electrical leads electrically connected to the component and sealably extending through the housing.

2. The package of claim 1 wherein the screen mesh is a flexible material which conforms to the top surface of the component.

3. The package of claim 1 wherein the screen mesh is selected from the group consisting of copper, aluminum and graphite.

4. The package of claim 1 wherein one of the layers is exposed to the outside of the housing.

5. The package of claim 1 wherein the housing is a thermosetting epoxy.

6. The package of claim 5 wherein the epoxy is selected from the group consisting of anhydride epoxy, novalak epoxy and polyimide epoxy.

7. The package of claim 1 wherein the housing is a thermoplastic material selected from the group consisting of polyphenylene sulfide, polyetherimide, polyethersulfone, liquid crystal polymers, and polyetheretherketone.

8. The package of claim 1 wherein the housing is plastic.

9. The package of claim 1 wherein the component is a substrate and the substrate supports an integrated circuit chip within the package.

10. The package of claim 1 wherein the component is an integrated circuit chip.

11. The package of claim 10 wherein the leads are connected to the chip by tape-automated-bonded leads.

12. The package of claim 10 wherein the leads are connected to the chip by wire bonds.

13. The package of claim 10, further including a substrate within the package supporting the chip.

14. The package of claim 13, further including a plurality of fasteners securing the screen mesh to the substrate.

15. The package of claim 13, further comprising a heat spreader in contact with the substrate on the side opposite the chip.

16. An encapsulated integrated circuit package, comprising:
   an electronic component wherein said component is an integrated circuit chip;
   a substrate within the package supporting the chip;
   a first thermally conductive screen mesh positioned adjacent to the component;
   a second thermally conductive screen mesh positioned adjacent to the substrate on the side opposite the chip;
   a non-electrically conductive thermosetting or thermoplastic material forming a housing enclosing the component and bonded to the screen mesh; and
   a plurality of electrical leads electrically connected to the component and sealably extending through the housing.

17. The package of claim 16 wherein the screen mesh provides RF shielding for the chip.

18. An encapsulated integrated circuit package, comprising:
   an integrated circuit chip;
   a substrate supporting the chip;
   a thermally conductive flexible wire screen mesh positioned adjacent to the chip;
   a non-electrically conductive thermosetting or thermoplastic material forming a housing which moldably encapsulates the chip and the substrate wherein the screen mesh is molded into the housing but at least some of the screen mesh is exposed to the outside of the housing; and
   a plurality of electrical leads electrically connected to the chip and sealably extending through the housing.

19. The package of claim 18 wherein the housing is selected from the group consisting of anhydride epoxy, novalak epoxy, polyimide epoxy, polyphenylene sulfide, polyetherimide, polyethersulfone, liquid crystal polymers and polyetheretherketone.

20. The package of claim 18 wherein the housing is plastic.

21. The package of claim 18 wherein the screen mesh comprises several layers.

22. The package of claim 18, further including a plurality of fasteners securing the screen mesh to the substrate.

23. The package of claim 18, further comprising a heat spreader in contact with the substrate on the side opposite the chip.

24. The package of claim 18, further comprising a second thermally conductive screen mesh positioned adjacent to the substrate on the side opposite the chip.

25. The package of claim 18 wherein the screen mesh provides RF shielding for the chip.

26. The package of claim 18 wherein the wire screen mesh is selected from the group consisting of copper, aluminum and graphite.

27. The package of claim 18 wherein the wire screen mesh is mechanically spaced from the chip.

28. An encapsulated integrated circuit package, comprising:
an electronic component;
a thermally conductive flexible wire screen mesh positioned adjacent to the component;
a plurality of mechanical fasteners wherein said fasteners are nuts and bolts securing only the outer edge of the screen mesh to the component;
a non-electrically conductive thermosetting or thermoplastic material forming a housing enclosing the component and bonded to the screen mesh; and
a plurality of electrical leads electrically connected to the component and sealably extending through the housing.

29. The package of claim 28 wherein the wire mesh screen is rectangular and a fastener is secured to each corner of the screen.

30. The package of claim 28 further including an integrated circuit chip on the electronic component wherein the electrical leads are electrically interconnected to the chip but electrically isolated from the wire screen mesh.

31. The package of claim 30 wherein the wire screen mesh is mechanically spaced from the chip.

* * * * *